(12) United States Patent
Bräutigam et al.

(10) Patent No.: US 9,434,509 B2
(45) Date of Patent: Sep. 6, 2016

(54) PACKAGE FOR METAL-CERAMIC SUBSTRATE AND METHOD FOR PACKING SUCH SUBSTRATES

(75) Inventors: Johann Bräutigam, Oberbibrach (DE); Erich Ernstberger, Windischeschenbach (DE); Heiko Schweiger, Oberbibrach (DE); Jürgen Schulz-Harder, Lauf (DE)

(73) Assignee: ROGERS GERMANY GMBH, Eschenbach (DE)

( * ) Notice: Subject to any disclaimer, the term of this patent is extended or adjusted under 35 U.S.C. 154(b) by 903 days.

(21) Appl. No.: 13/639,261

(22) PCT Filed: Mar. 30, 2011

(86) PCT No.: PCT/DE2011/000354
§ 371 (c)(1),
(2), (4) Date: Dec. 10, 2012

(87) PCT Pub. No.: WO2011/124205
PCT Pub. Date: Oct. 13, 2011

(65) Prior Publication Data
US 2013/0213853 A1 Aug. 22, 2013

(30) Foreign Application Priority Data

Apr. 7, 2010 (DE) .................. 10 2010 014 138
Apr. 28, 2010 (DE) .................. 10 2010 018 668

(51) Int. Cl.
*B65D 85/48* (2006.01)
*B65D 81/20* (2006.01)
(Continued)

(52) U.S. Cl.
CPC ............ *B65D 25/00* (2013.01); *A23C 9/1307* (2013.01); *A23C 9/137* (2013.01); *A23C 9/1524* (2013.01); *A23F 5/243* (2013.01); *B65B 5/08* (2013.01); *H01L 21/67353* (2013.01); *H01L 21/67356* (2013.01); *A23C 2210/30* (2013.01); *A23C 2270/05* (2013.01); *A23V 2002/00* (2013.01); *B65D 75/02* (2013.01); *B65D 81/2007* (2013.01)

(58) Field of Classification Search
CPC .. B65D 25/00; B65D 25/04; B65D 81/2023; B65D 81/2038; B65D 75/02; B65D 81/2007; H01L 21/67353
USPC ............. 206/454–456, 497, 524.8, 561, 564, 206/565, 707, 723–725
See application file for complete search history.

(56) References Cited

U.S. PATENT DOCUMENTS 4,548,824 A * 10/1985 Mitchell ................ B65D 21/08
206/497
4,933,193 A * 6/1990 Fisher ................ B65D 81/3453
206/497
(Continued)

FOREIGN PATENT DOCUMENTS

CN          1242335       1/2000
JP          61-152576     7/1986
(Continued)

*Primary Examiner* — Luan K Bui
(74) *Attorney, Agent, or Firm* — Welsh Flaxman & Gitler LLC

(57) ABSTRACT

A package for holding metal-ceramic substrates, the package includes a tray manufactured from a flat material with at least one holder adapted to a format of the metal-ceramic substrates for holding the metal-ceramic substrates, an interior of the at least one holder of the tray being defined by a bottom and circumferentially by an edge and by at least one covering completely accommodating the tray, and the tray is sealed vacuum-tight by the covering and the covering has an interior accommodating the tray, and the tray is impinged with a vacuum so that the metal-ceramic substrates are fixed in the at least one holder by clamping on an edge-side of the tray by forces (F) exerted on the edge resulting from the ambient pressure.

8 Claims, 8 Drawing Sheets

(51) Int. Cl.
*B65D 71/08* (2006.01)
*B65D 25/00* (2006.01)
*H01L 21/673* (2006.01)
*B65B 5/08* (2006.01)
*A23C 9/13* (2006.01)
*A23C 9/137* (2006.01)
*A23C 9/152* (2006.01)
*A23F 5/24* (2006.01)
*B65D 75/02* (2006.01)

(56) References Cited

U.S. PATENT DOCUMENTS

| | | | |
|---|---|---|---|
| 5,546,731 A * | 8/1996 | Wyslotsky | B65D 1/44 206/524.8 |
| 6,112,795 A | 9/2000 | Emmett et al. | |
| 6,296,122 B1 * | 10/2001 | Nakazono | B65D 21/0209 206/511 |
| 6,474,475 B1 * | 11/2002 | Bjork | B65D 25/04 206/499 |
| 6,837,374 B2 * | 1/2005 | Nigg | H01L 21/67346 206/454 |
| 7,410,055 B2 * | 8/2008 | Plank | B01L 9/52 206/456 |
| 7,520,389 B2 * | 4/2009 | Lalouette | G06F 1/184 206/724 |
| 2006/0016156 A1 * | 1/2006 | Bush | A61M 5/002 53/434 |

FOREIGN PATENT DOCUMENTS

| | | |
|---|---|---|
| JP | 11-198938 | 7/1999 |
| JP | 2007-505798 | 3/2007 |
| WO | WO2009/019190 | 2/2009 |

\* cited by examiner

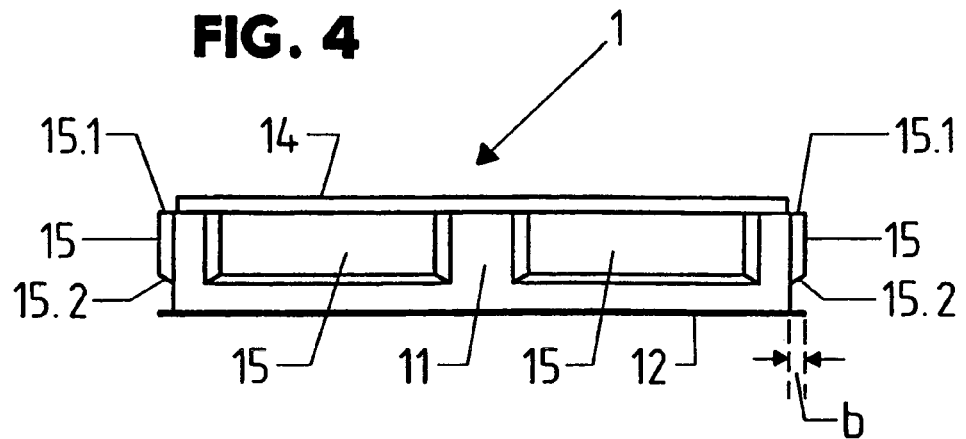
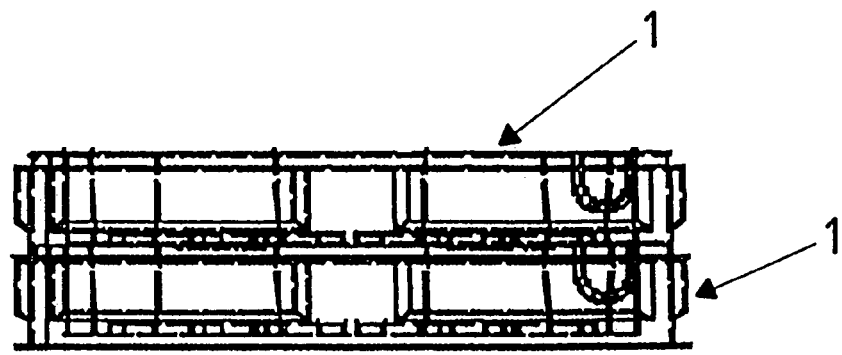

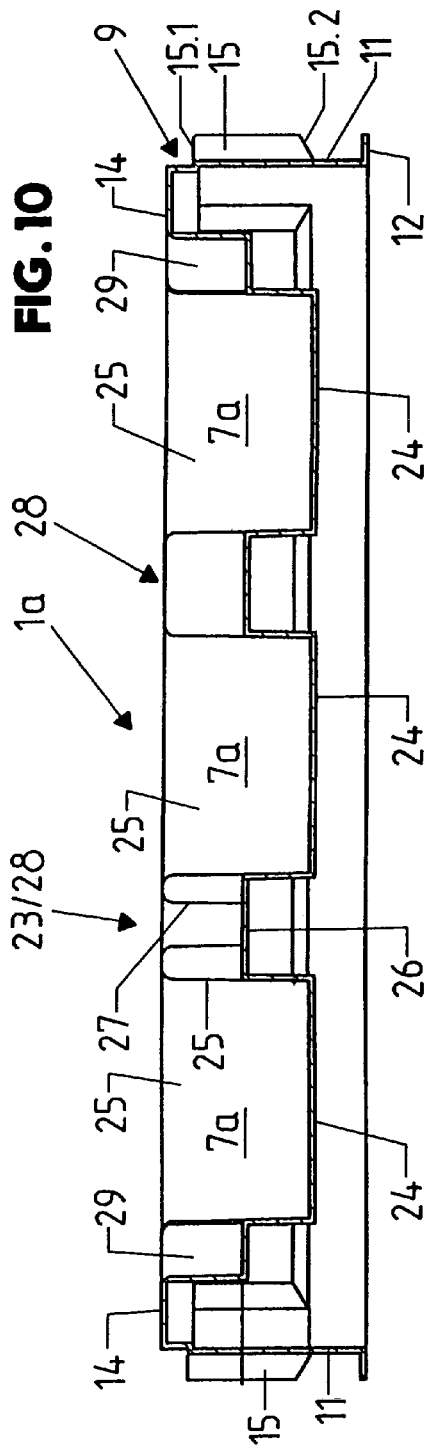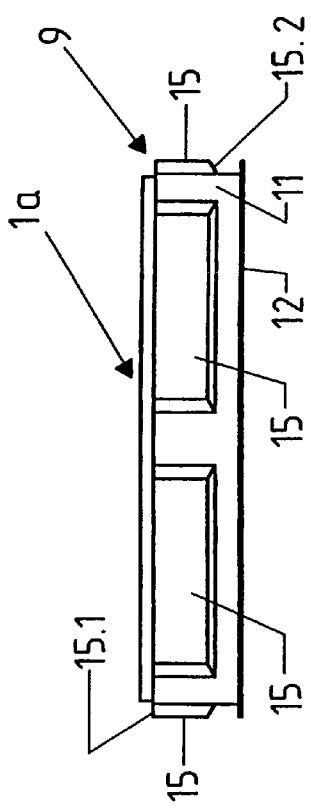

PACKAGE FOR METAL-CERAMIC SUBSTRATE AND METHOD FOR PACKING SUCH SUBSTRATES

BACKGROUND OF THE INVENTION

The invention relates to a package for metal-ceramic substrates consisting of a ceramic layer and a plurality of single metallizations or structured areas formed on at least one surface side of the ceramic layer. Between the structured areas, break-off lines are made into the ceramic layer.

Known in the art is the DCB (Direct Copper Bond) technology, which is used to bond metal layers or sheets (e.g. copper sheets or foils) with each other and/or with ceramic or ceramic layers, namely using metal or copper sheets or metal or copper foils, which are provided on their surfaces with a layer or coating (hot-melt layer) resulting from a chemical bond between the metal and a reactive gas, preferably oxygen. In this method, which is described for example in US-PS 37 44 120 and in DE-PS 23 19 854, this layer or coating (hot-melt layer) forms a eutectic with a melting temperature below the melting temperature of the metal (e.g. copper), so that the layers can be bonded to each other by placing the foil on the ceramic and heating all layers, namely by melting the metal or copper essentially only in the area of the hot-melt layer or oxide layer.

This DCB method then comprises for example the following steps:

Oxidation of a copper foil so as to produce an even copper oxide layer;

placing the copper foil on the ceramic layer;

heating the composite to a process temperature between approx. 1025 and 1083° C., e.g. to approx. 1071° C.; and then cooling to room temperature.

Known in the art are metal-ceramic substrates, also large-surface metal-ceramic substrates or metal-ceramic substrates manufactured as multiple printed panels, as substrates or circuit boards for electric circuits or modules. These metal-ceramic substrates consist, for example, of a ceramic layer or of a relatively large-surface ceramic substrate, which is provided on at least one surface side with a metallization, for example, in the form of a copper foil using the DCB bonding method. The metallizations are structured to form single metallizations that are homogeneous. Between these single metallizations, break-off lines are made in the rectangular or square ceramic layer, on which the metal-ceramic substrate can be separated by breaking them into single substrates or single circuits or modules, preferably after being equipped with electric components. The break-off lines allow easy separation of the large-surface metal-ceramic substrate into single substrates, but also relatively easily result in accidental breakage of the metal-ceramic substrates, especially during transport.

Large-surface metal-ceramic substrates or metal-ceramic substrates manufactured as multiple printed panels according to the invention are understood to be such metal-ceramic substrates that have a format of 178 mm×127 mm or larger and on at least one surface side of the ceramic layer, but preferably on both surface sides of the ceramic layer have single metallizations, between which the break-off lines extend into the ceramic layer, so that by breaking along this break-off line the large-surface metal-ceramic substrate can be separated into single substrates, which respectively form components or the printed circuit board of a circuit or module.

It is an object of the invention is to present a package that enables the safe transport and storage of large-surface metal-ceramic substrates manufactured as multiple printed panels.

In a further embodiment of the invention the package is designed for example so that the edge of the tray is embodied as a circumferential U-profile that is open toward the tray bottom side, and/or the at least one holder formed in the tray for holding at least one metal-ceramic substrate and adapted to the format of the metal-ceramic substrates has corner recesses, and/or projections are formed on the at least one wall circumferentially limiting the at least one holder and projecting into the holder, which (projections) form contact surfaces for the at least one metal-ceramic substrate and which define a partial space of the holder serving to accommodate this substrate, and/or the wall circumferentially limiting the at least one holder is inclined at least on partial areas, for example on the projections opposing the plane of a bottom of the at least one holder, namely so that the wall in this partial area, when the package is not closed, encloses an angle somewhat larger than 90°, for example an angle between 90 and 95°, and/or the tray is manufactured in one piece by deep drawing from a flat material, preferably from a plastic flat material, for example from a thermoplastic flat material, and/or the material of the tray, preferably the material used for the deep drawing, has a material thickness between 0.3 and 4 mm, preferably a material thickness of 1 mm, and/or when the package is closed, at least one tray with at least one metal-ceramic substrate in the at least one holder is accommodated in a vacuum-tight sealed and evacuated external package, namely preferably so that forces created by the external ambient or atmospheric pressure on the edge fix the at least one metal-ceramic substrate in the holder by circumferential clamping, and/or the external package or covering is made from a bag or hose of a preferably weldable flat material, for example from a weldable foil, and/or the interior of the sealed covering or external package is filled with a protective gas, preferably with nitrogen, namely preferably with a pressure that is below the ambient or atmospheric pressure, and/or the foil forming the covering or external package is provided with a diffusion barrier against moisture and/or oxygen, the above characteristics of the package being able to be used singly or in any combination.

Further embodiments, advantages and possible applications of the invention are disclosed by the following description of exemplary embodiments and the drawings. All characteristics described and/or pictorially represented, alone or in any combination, are subject matter of the invention, regardless of their being summarized or referenced in the claims. The content of the claims is also included as part of the description.

BRIEF DESCRIPTION OF THE DRAWINGS

The invention is described below based on exemplary embodiments with reference to the drawings, wherein: The invention is illustrated in the drawings, where:

FIG. 4 shows a side view and a front view of the tray of FIG. 1;

FIG. 5 shows a tray stack in side view;

FIG. 10 shows a section through the tray of FIG. 8 corresponding to the section line A-A of FIG. 9; and FIG. 11 shows a side view and a front view of the tray of FIG. 8.

DETAILED DESCRIPTION OF THE INVENTION

Figure 6:
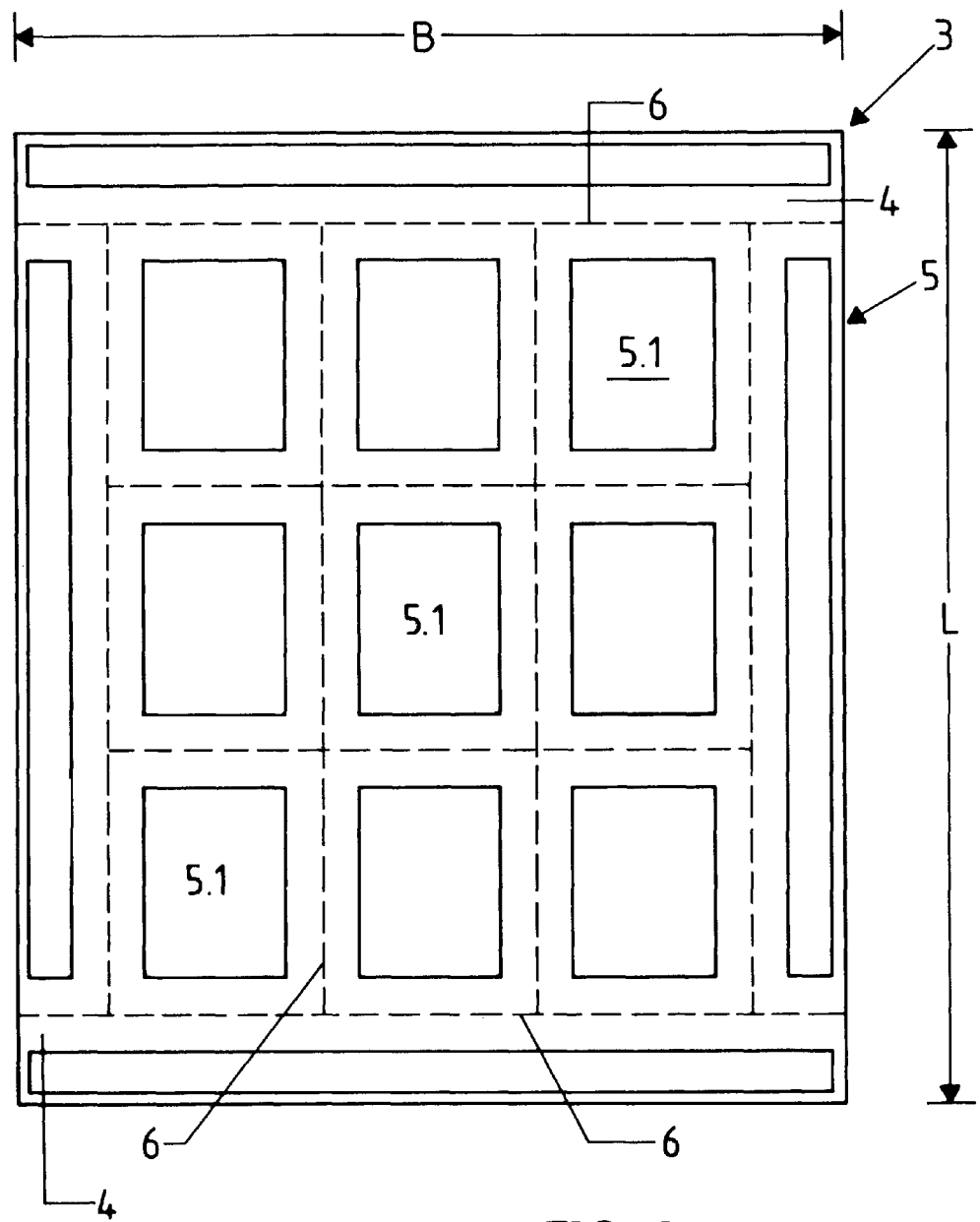
FIG. 6 shows a simplified depiction in top view of a multiple metal-ceramic substrate.

The tray (external package or packaging tray) generally designated 1 in the drawings is an essential component of a package 2, in particular a transport and storage package for a plurality of large-format metal-ceramic substrates 3 manufactured as multiple printed panels. As depicted in FIG. 6, these consist in the manner known to persons skilled in the art essentially of a large-surface ceramic substrate or of a large-surface ceramic layer 4, which is provided on its top and bottom side with metallizations 5 in the form of copper layers, manufactured, for example, by DCB bonding. The metallizations 5 are structured so that they respectively form a plurality of structured areas 5.1, namely in the manner that each structured area 5.1 on the top side is directly opposed by a structured area of the same size on the bottom side. The structured areas 5.1 on the top side respectively form strip conductors and/or contact surfaces etc., while the structured areas 5.1 on the bottom side respectively are designed as non-structured metal surfaces. Between the structured areas 5.1 break-off lines 6 are made into the ceramic layer 4, by laser treatment, on which the metal-ceramic substrate 3, preferably after equipping of the single structured areas 5.1 with electrical components, can be separated into single electric circuits or modules by breaking it into single substrates. However, the break-off lines 6 make the large-surface metal-ceramic substrates 3 very sensitive to breakage. This circumstance is especially taken into account by the package 2 described in more detail below.

The tray 1 is manufactured by deep drawing from a thermoplastic flat material or from a foil of thermoplastic material. The thermoplastic material has a material thickness between 0.3 mm and 4 mm, preferably has a thickness of approximately 1 mm, so that the tray 1 forms a receiving opening or holder 7 that is open on the top side of the tray 1, but otherwise is closed by a bottom 8 and by a circumferential edge 9. A suitable material for the manufacture of the tray 1 is (polyethylene terephthalate) PET. The holder 7 is adapted to the rectangular design of the metal-ceramic substrate 3 when viewed from above, and the depth of the holder 7 is chosen so that there is room for a plurality of metal-ceramic substrates 3 stacked one above the other, for example a total of fifteen to twenty metal-ceramic substrates 3, therein. The shape of the holder 7 is further chosen so that the metal-ceramic substrates 3 are accommodated in the holder 7 with little play so that when the package 2 is open, convenient insertion and removal of the metal-ceramic substrates into the holder 7 and from the holder opening is possible.

The bottom 8 is provided with a plurality of projections 10, which are formed from the flat material forming the tray 1 and project over the plane of the bottom 8 into the holder 7. The projections 10, which for the most part are oriented with their longitudinal extension in an axis direction at an angle to the circumferential sides of the tray 1, produce an increased bottom stability and therefore also increased stability for the tray 1 overall. The projections 10 further form contact surfaces for the bottommost metal-ceramic substrate 3, i.e. the substrate adjacent to the bottom 8, held in the holder 7.

The circumferential edge 9 can be described as forming four rectangularly adjoining and intermerging edge areas or sections 9.1-9.4, namely the two opposing and the longer sides of the rectangular tray 1 when viewed from the top forming edge areas 9.1 and 9.2 and the two likewise opposing and narrow sides of the tray 1 forming the edge areas 9.3 and 9.4. All edge areas 9.1-9.4 are designed in the form of a circumferential U-profile that is open toward the bottom of the tray 1, namely with an outer leg or profile section 11, which forms the circumferential outer surface of the tray 1 and on its lower, free end merges into a leg 12, which protrudes outward at a right angle from the profile section 11 and is designed as a circumferential edge, namely so that the plane of the leg 12 is oriented parallel to the plane of the bottom 8, but extends beneath the plane of the bottom 8 and is at a distance from this plane. The edge area formed by the circumferential leg 12 is therefore the surface with which the tray 1 can be placed on a level underlying surface.

The circumferential edge 9 further comprises an inner leg or wall section 13, which laterally or circumferentially limits the holder 7 and merges into the bottom 8, and an upper wall section 14 connecting the wall sections 11 and 13 in the manner of a yoke section, which (wall section) in a plane at a distance from the plane of the bottom 8 and parallel to this plane is designed circumferentially and forms the upper opening edge surface surrounding the open side of the holder 7.

In the depicted embodiment, the wall section 11 is designed to be even or essentially even on the edge areas 9.1-9.4 respectively and is provided with projections 15 formed from this wall section and protruding over the outer surface of the wall section 11, which (projections) in a top view of the wall section 11 and in a side view of the respective edge area 9.1-9.4 in the depicted embodiment are respectively rectangular, namely so that each projection 15 is oriented with its longitudinal side parallel to the longitudinal extension of the respective edge area 9.1-9.4 and is at a distance both from the upper wall section 14 and from the lower edge of the wall section 11 comprising the leg 12. In the depicted embodiment, two such projections 15 are provided on each edge area 9.1-9.4, so that at least on the respective edge area 9.1-9.4 similarly designed projections 15 are arranged with their upper longitudinal edge 15.1 and with their lower longitudinal edge 15.2 in a common plane respectively and also that the two projections 15 on each edge area 9.1-9.4 are at a distance from each other and also from the respective corners 16 forming the transition between two adjacent edge areas. The upper edge area 15.1 extends respectively perpendicular to the plane of the wall section 11 and therefore lies in a plane parallel to the plane of the bottom 8 and parallel to the plane of the upper edge section 14. The distance of the upper edge 15.1 from the plane of the wall section 14 is smaller than the distance of the plane of the leg 12 from the bottom 8. The lower edge area 15.2 of each projection 15 extends at an angle to the plane of the wall section 11 and encloses with the perpendicular on the wall section 11 an acute angle, which opens toward the outer side of the tray 1 and in the depicted embodiment is approximately 30°.

The inner wall section 13 is formed so that it forms a plurality of recesses and, between these, projections protruding into the holder 7, namely four corner recesses 17, each of which is located on a corner or transition area between two edge areas 9.1-9.4, a recess 18 respectively in the middle of the edge area 9.1 and 9.2, two projections 19 respectively on the edge areas 9.1 and 9.2, which (projections) are at a distance from each other due to the middle recess 18 and on which (projections) a corner recess 17 respectively adjoins, as well as a middle projection 20 on each edge area 9.3 and 9.4 between the corner recesses 17 there. A corner recess 17 is formed with an enlargement 17.1, namely for holding a moisture absorbing element.

At least on the corner recesses 17 or on surface sections limiting these corner recesses and on the end-side surface sections of the projections 19 and 20 the tray 1 is slightly conical on the inner wall section 13, i.e. the inner wall section 13 encloses an angle there with the plane of the bottom 8, which (angle) opens toward the interior of the holder 7 and is somewhat larger than 90°, e.g. between 90° and 95° and in the depicted embodiment is approximately 92°. The end-side surface areas of the projections 19 and 20 form contact surface for the metal-ceramic substrates 3 accommodated in a stack in the holder 7, i.e. the distance of the mutually opposing projections 19 at the edge areas 9.1 and 9.2 is equal to or slightly larger than the width B of the metal-ceramic substrates 3. The distance of the two mutually opposing projections 20 at the edge areas 9.3 and 9.4 is approximately equal to or slightly larger than then length L of the metal-ceramic substrates. The space between the projections 19 and 20 is therefore the partial space of the holder 7 intended for holding the metal-ceramic substrates 3.

The projections 19 and 20 or their end-side surface areas ensure, even when the package is not yet closed, the safe and especially also largely non-slip arrangement of the metal-ceramic substrates 3 in the holder 7. The corner recesses 17 further ensure that the especially sensitive corner areas of the metal-ceramic substrates 3 are protected against the effect of any force, for example from jolts, during transport.

As the figures show, the recesses 18 are especially deep, i.e. the distance of the inner surface of these recesses from the outer wall section 11 is smaller than the corresponding distance of the inner surface of the corner recesses 17 from the outer wall section 11 at the edge areas 9.1 and 9.2, so that the deep design of the recesses 18 enables convenient manual and/or mechanical gripping of the metal-ceramic substrates 3 during insertion into and removal from the holder 7. It goes without saying that the corner recesses 17 and the middle recesses 18 respectively in the upper wall section 14 extend to the bottom 8 and that the edge 9, despite the design of the edge areas 9.1-9.4 or of the wall sections 11, 13 and 14 described above is continuous, i.e. without interruptions or openings and manufactured as one piece with the bottom 8.

Figure 1:
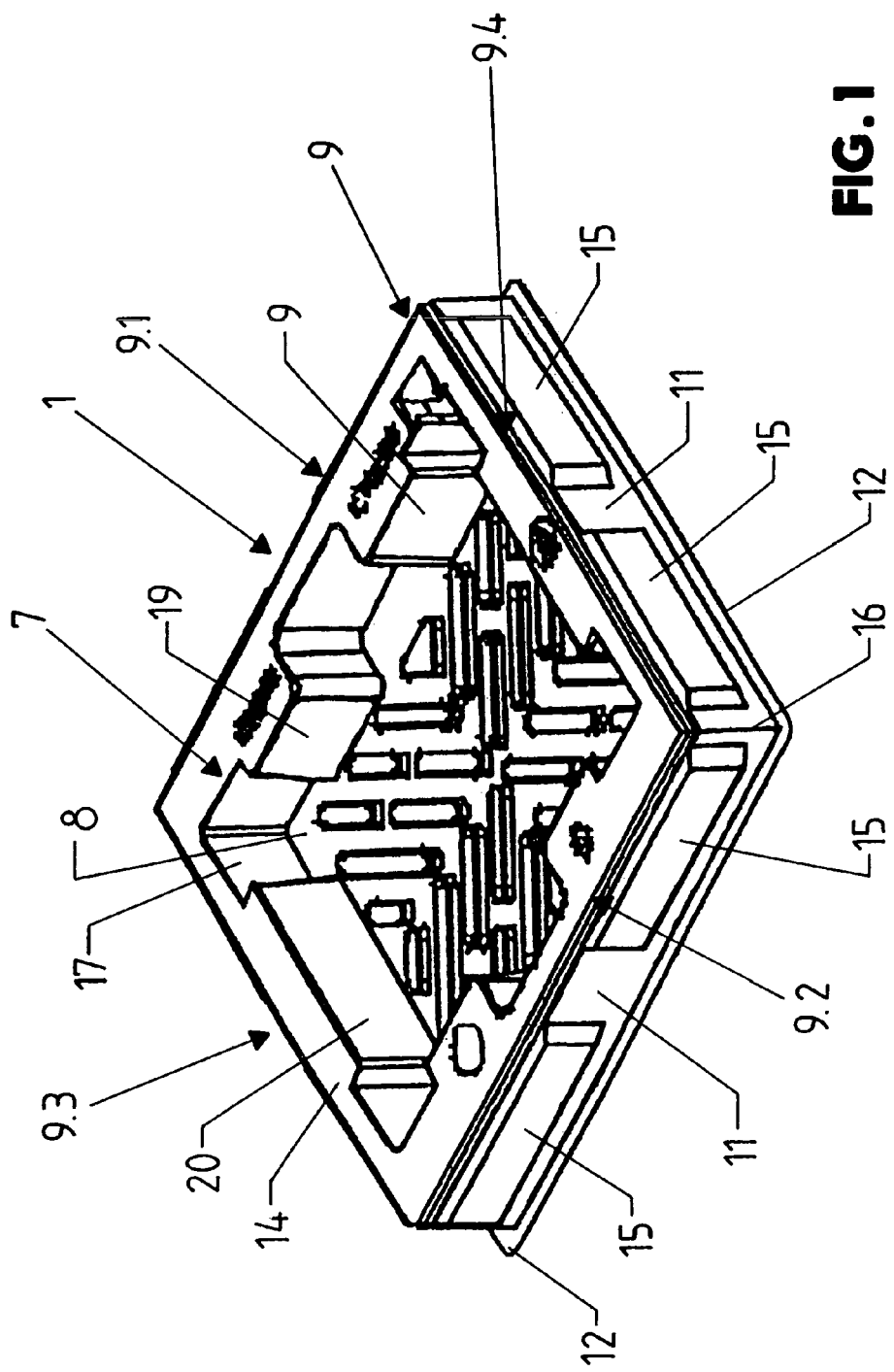
FIG. 1 shows a perspective view from above of a tray of the package according to the invention.
Figure 2:
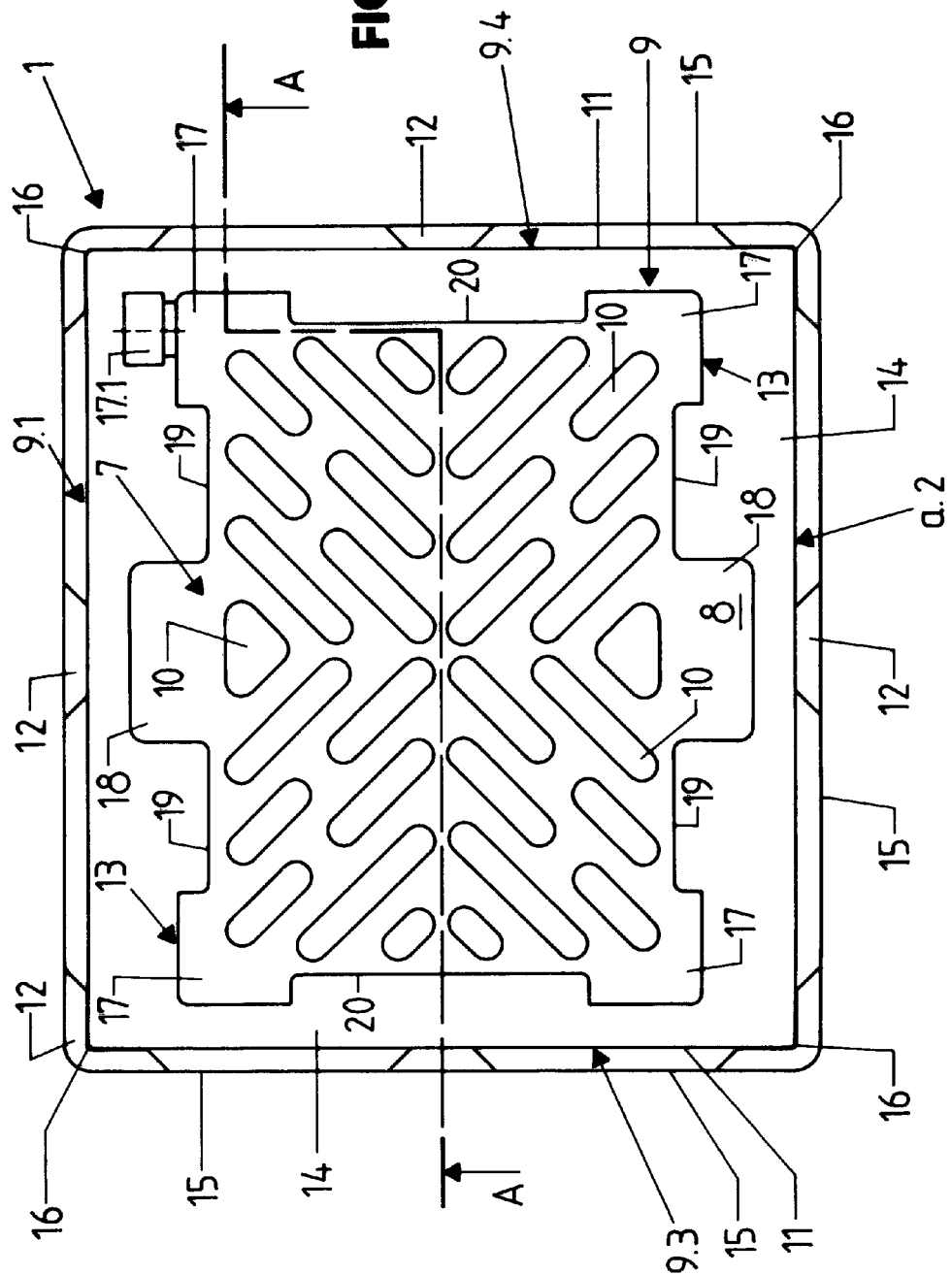
FIG. 2 shows the tray of FIG. 1 in top view.

As shown especially in FIGS. 1 and 2, the edge areas 9.1 and 9.2, especially also on the upper wall section 14 in the area of the projections 19 are wider than the edge areas 9.3 and 9.4 on the upper wall section 14 in the area of the projections 20. In the depicted embodiment the mutually opposing projections 19 have a distance of approximately 127 or 128 units and the mutually opposing projections 20 have a distance of approximately 178 or 179 units, the bottom surfaces of the two mutually opposing recesses 18 have a distance of approximately 170 units, namely with outer dimensions of the tray 1 of 236 at the edge areas 9.1 and 9.2 and of 208 units at the edge areas 9.3 and 9.4 (measured respectively at the free end of the circumferential leg 12), one unit being 1 mm. The width of the edge areas 9.1 and 9.2 in the area of the projections 19 is approximately 19% to 20% of the outer dimension of the tray 1 at the circumferential areas 9.3 and 9.4. The width of the edge areas 9.3 and 9.4 in the area of the projections 20 is approximately 12% to 13% of the outer dimension of the tray 1 at the edge areas 9.1 and 9.2.

Figure 3:
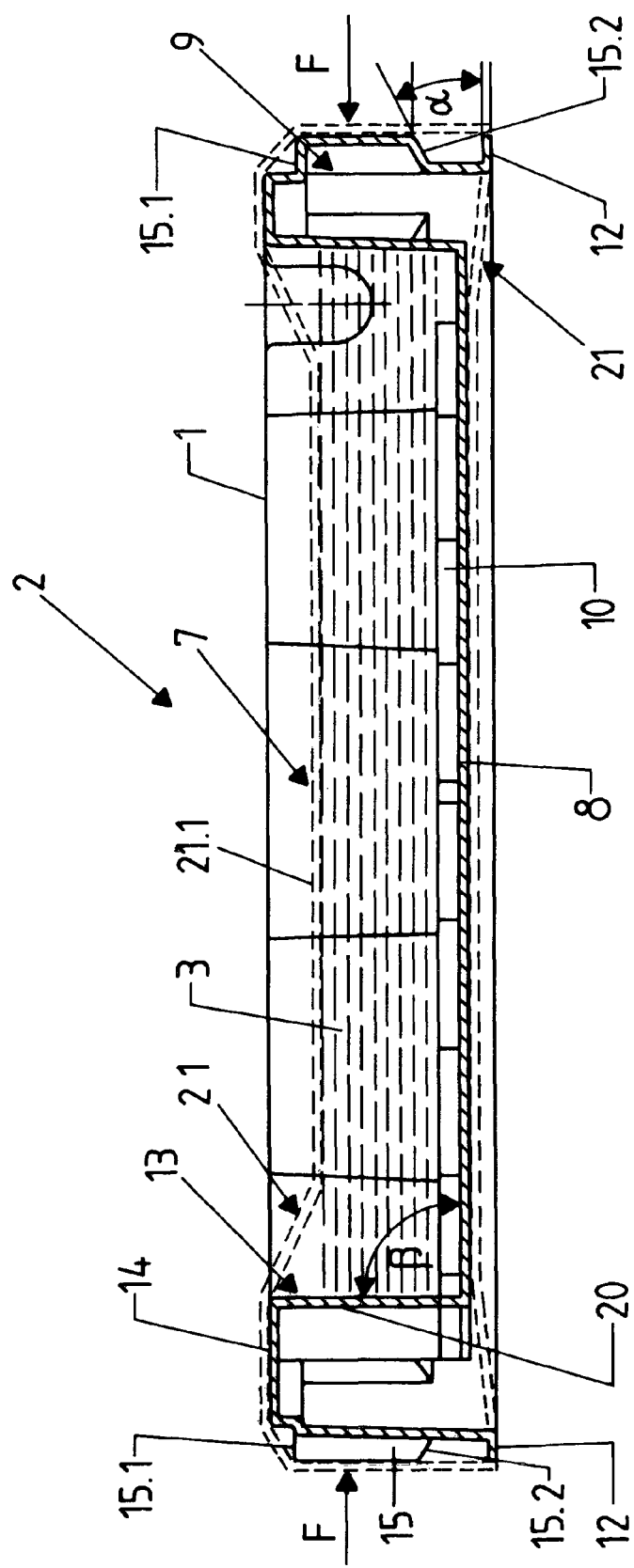
FIG. 3 shows a section through the tray of FIG. 1 corresponding to the line A-A of FIG. 2.

A further component of the package 2 is a hose-like or bag-like covering 21, which completely encloses the tray 1 and the metal-ceramic substrates 3 located in the holder 7 and is schematically indicated by 21 in FIG. 3. The covering 21 consists of a weldable foil, preferably a plastic foil. The foil is in the simplest case single-layered, but preferably multi-layered, being equipped with at least with an additional barrier layer or metal coating. In packaged condition the covering 21 completely enclosing the tray 1 with the metal-ceramic substrates 3 located in the holder 7 is evacuated and sealed vacuum-tight, so that the covering 21 is pressed not only with a sub-section 21.1 extending over the open side of the holder 7 by the ambient pressure against the top side of the uppermost metal-ceramic substrate accommodated in the holder 7, but the ambient pressure also exerts pressure forces on the edge 9 of the tray 1 and therefore especially on the profile section 11 and the projections 15 there, as indicated by the arrows F in FIG. 3.

This causes the edge areas 9.1-9.4 and thereby especially also the projections 19 and 20 to be moved inward, so that additional clamping of the metal-ceramic substrates 3 is achieved on their circumference in the holder 7. Due to the projections 15 and their design and in particular also due to the design of the edge 9 as a downwardly open U-profile, it is achieved that the forces F generated by the ambient pressure cause pivoting, in particular also of the end faces of the projections 19 and 20 in the holder 7 for the purpose of decreasing the respective angle, which results in especially effective holding of the metal-ceramic substrates 3 in the holder.

For this fixing of the metal-ceramic substrates 3 it is crucial that the holder 7 is designed with the corner recesses 17, so that due to the narrower design of the circumferential edge 9 at these corner recesses the respective metal-ceramic substrate 3 is held in the holder 7 by clamping deformation of the edge 9 and the sensitive corners of the metal-ceramic substrates 3 are kept free from external applications of force. Due to the design of the upper and lower edges 15.1 and 15.2 of the projections 15 as described above these projections are deformed under the application of the forces F so that the effect of the forces F is concentrated on the area of the upper edges 15.1.

The packaging of the metal-ceramic substrates of the package 2 is achieved for example in the manner that after insertion of the required number of metal-ceramic substrates 3 into the holder 7, the tray 1 with the metal-ceramic substrates 3 is inserted into the covering 21. Then the package consisting of the tray 1 with the metal-ceramic substrates 3 and the covering 21 is inserted into an evacuatable chamber, which then is evacuated to a pressure of 60% to 90% of the normal or ambient pressure (of the normal atmospheric pressure), preferably to a pressure of ca.

70% of the normal or ambient pressure and in which at this vacuum pressure the vacuum-tight sealing of the covering 21 is achieved by welding.

In a preferred embodiment of this method, prior to the vacuum-tight sealing of the covering 21 the interior of this covering is purged with a purging or shielding gas, for example with nitrogen, which in particular prevents oxidation of the metallizations 5 and then the covering 21 is sealed vacuum-tight under vacuum pressure. In this method the package consisting of the tray 1 with the metal-ceramic substrates 3 and the initially still open covering 21 completely enclosing the tray 1 is likewise inserted into the evacuatable chamber, the latter then being evacuated in a first evacuation step to 60% to 99%, for example to 70% of the normal or ambient pressure, then purged with the purging or shielding gas, for example with nitrogen, and then likewise evacuated to 60% to 90%, for example to 70% of the normal pressure, the vacuum-tight sealing of the covering 21 taking place by welding in this vacuum.

The bottom projections 10 serve not only, as described above, as reinforcement for the bottom 8 and as a contact surface for the bottommost metal-ceramic substrate inserted into the holder 7, but also ensure that flow channels are formed between this bottommost metal-ceramic substrate 3 and the inner surface of the bottom 8, which (flow channels) enable the evacuation and/or purging also of the areas between the bottommost metal-ceramic substrate 3 and the bottom 8 and simultaneously provide "rear ventilation" for any air or shielding gas containing moisture and for dissipation of this moisture to the demoisturizing means (e.g. demoisturizing or drying pill) accommodated in the expansion 17.1 and which is normally used in packages.

Figure 7:
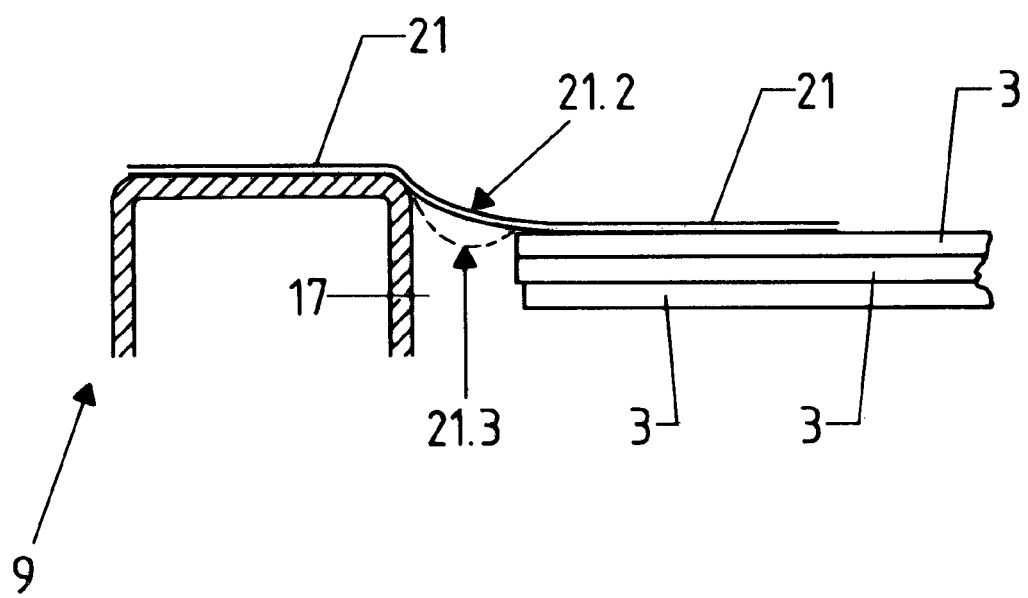
FIG. 7 shows a simplified and enlarged partial section through the package of FIGS. 1-6 in the corner area of the holder.
Figure 8:
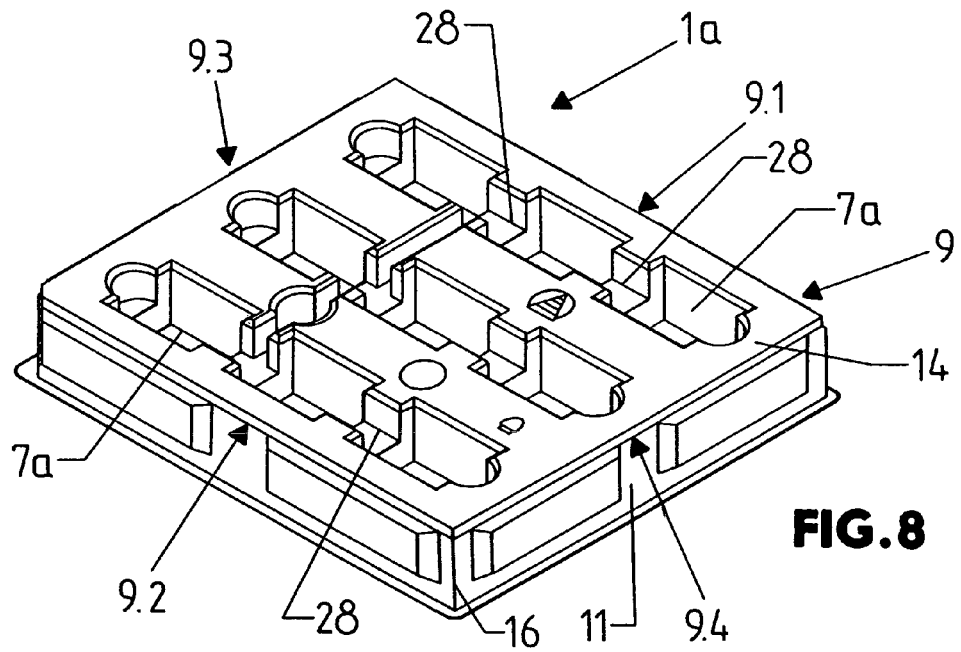
FIG. 8 shows a perspective view from above of a tray of the package in a further embodiment according to the invention.
Figure 9:
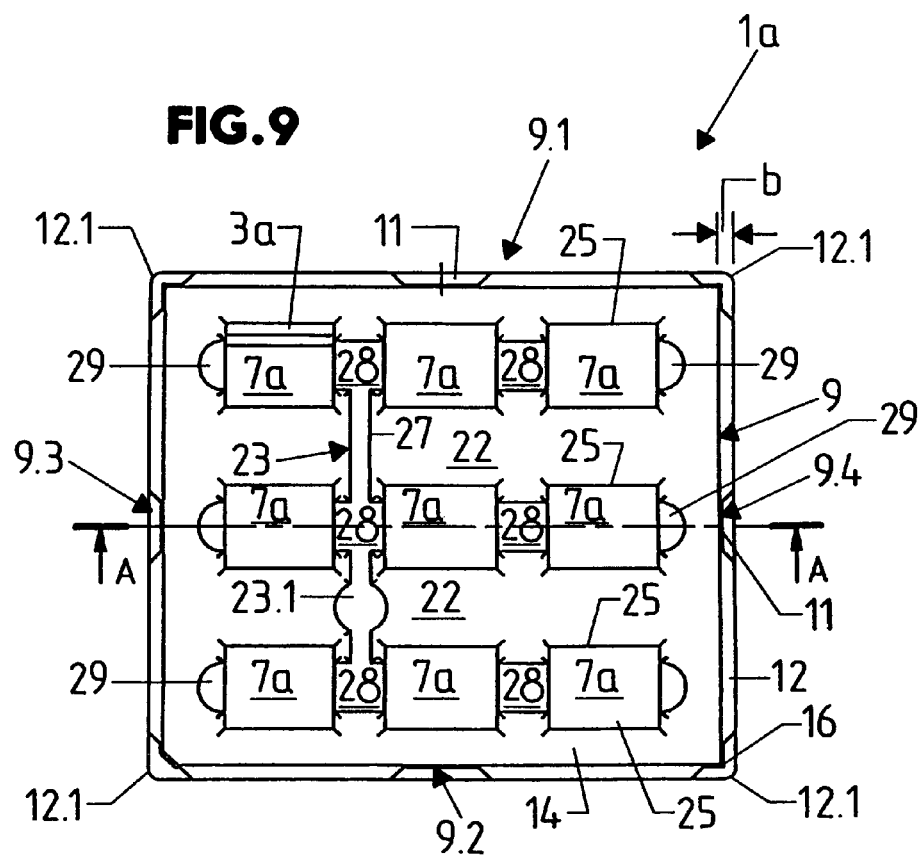
FIG. 9 shows the tray of FIG. 8 in top view.

Preferably the vacuum is regulated within the closed package or in the closed covering so that the covering 21 has the gradient depicted in FIG. 7 by 21.2 especially also in the sensitive corner areas of the metal-ceramic substrates 3 and thereby especially in the sensitive corner areas of the uppermost metal-ceramic substrate 3 furthest from the bottom 8, which (gradient) is characterized in that the foil forming the covering 21 there, starting from the edge or from the edge area of the uppermost metal-ceramic substrate 3, extends spanning the corner recess 17 to the edge 9 or to the wall section 14 forming the top side of this edge, i.e. is not drawn into the corner recess 17, as indicated in FIG. 7 by the broken line 21.3, but rather the distance of the covering from the bottom 8 continuously increases in the area of the gradient 21.2 toward the edge, starting from the metal-ceramic substrate 3. The gradient 21.2 prevents pressure forces exerted from above from affecting the respective edge or edge area of the metal-ceramic substrates 3.

The circumferential edge 9, due to its U-profile shape and in particular also with the effect of the projections 15, 19 and 20, forms a "crumple zone", which in case of potential impacts on the sealed package 2 for example during transport, storage and/or handling prevents damaging forces from affecting the metal-ceramic substrates 3 accommodated in the holder 7.

In particular to prevent damage to the covering 21 or the foil forming this covering after evacuation and sealing, e.g. during transport or handling of the respective package 2, the leg 12 forming a circumferential lower edge section is rounded in the area of the corners 16 at 12.1, namely with a radius of curvature between 1.5 mm and 40 mm, the maximum radius of curvature $R_{max}$ being dependent on the width b, with which the leg 12 protrudes over the outer surface of the outer wall section 11. Therefore, the following formula applies to the maximum radius of curvature: $R_{max} = b \times \sqrt{2}$.

Likewise to prevent damage to the covering 21 after evacuation and sealing, the edges of the leg 12 or of the circumferential edge section formed by this leg are deburred or slightly rounded or tangent-bent or beaded.

To ensure the effectiveness of the crumple zone formed by the edge 9 the thickness of the edge 9, i.e. the distance between the outer surface of the wall section 11 and the inner surface of the holder 7 limiting this holder is 5 mm-45 mm, namely with the tray 1 or the package 2 having a design that is otherwise as compact as possible.

It was assumed above that the respective package 2 consists of the tray 1 with at least one metal-ceramic substrate 3 and of the evacuated and vacuum-sealed covering 21. Basically, it is also possible, however, corresponding to FIG. 5, to provide a plurality of trays 1 with the metal-ceramic substrates 3, stacked one above the other in a common evacuated and vacuum-sealed covering 21, the forces F resulting from the ambient pressure then also fixing the metal-ceramic substrates 3 in the bottom tray 1 in the holder 7 there, namely in the manner described above by the inward deformation of the edge areas 9.1-9.4. The trays 1 are then arranged so that the upper tray of two adjacent trays in the stack bears with its edge area formed by the circumferential leg 12 on the top side 15.1 of the projections 15 of the underlying tray.

FIGS. 8-11 show as a further embodiment a tray 1a, which can be used instead of the tray 1 for the package 2, namely for example likewise for rectangular metal-ceramic substrates 3a, which generally correspond to the substrates 3, but have substantially smaller outer dimensions than the substrates 3. The tray 1a differs from the tray 1 first of all in that the tray 1a, which likewise is manufactured by deep drawing as one piece from a suitable flat material, for example from a thermoplastic flat material or from a foil of a thermoplastic material with a material thickness between approximately 0.3 mm and 4 mm, preferably with a thickness of approximately 1 mm, comprises a plurality of holders 7a, namely respectively for holding a plurality of metal-ceramic substrates 3a arranged in a stack. On the outer circumference the tray 1a is designed corresponding to the tray 1, namely with the circumferential U-shaped edge or with the edge sections or areas 9.1-9.4 forming this edge 9 and merging into one another. Further, the tray 1a corresponds to the tray 1 in particular also with respect to the design of the wall section 11, the leg 12 there with the rounded corner areas 12.1 and the projections 15.

The holders 7a produced from the flat material during deep drawing, in the embodiment depicted in FIGS. 8-11, are arranged in three rows parallel to the three longer sides of the tray 1a, which is rectangular when viewed from the top, formed by the edge sections 9.1 and 9.2, namely with three holders 7a respectively in each row. In particular, the holders 7a are formed from the top side of the tray 1a and therefore in particular from the material forming the upper wall section 14 of the U-shaped edge 9, so that on the top side of the tray 1a the two outer rows of the holders 7a are respectively separated by or kept at a distance by a tray section 22 from the middle row of the holders 7a, the top side of the tray sections 22 lying in a common plane with the wall section 14 and the tray 1a in the area of the tray sections 22 likewise being designed as a U-profile that is open toward the bottom side of the tray.

The two tray sections 22 are interrupted by a depression 23, which extends parallel to the edge area 9.3, namely in the depicted embodiment between the holder 7a adjacent to this edge area and the respective consecutive holder 7a in each row. Between an outer row and the middle row of the holders 7a the depression 23 is provided with an expansion 23.1 for accommodating a moisture-absorbing element, for example a drying pill as normally placed in packages.

It goes without saying that the bottom 24 limiting the holders 7a at the bottom, the wall sections 25 circumferentially limiting the holders 7a, the bottom 26 of the groove-shaped recesses 23 and wall sections 27 laterally limiting these recesses merge into one another without interruption and also into the top side of the tray 1a or into the tray sections 22 there and into the wall sections 14, so that the holders 7a and the depressions 23 form a recess structure forming these components that is structured and open only on the top side of the tray but otherwise tightly sealed.

In detail the flat material forming the tray 1a is formed so that the holder 7a of each row is part of a common depression extending parallel to the edge areas 9.1 and 9.2, which (recess) has a reduced width in areas 28 between the mutually consecutive and mutually separated holders 7a in an axis direction parallel to the top side of the tray and perpendicular to the edge areas 9.1 and 9.2 and has a reduced depth perpendicular to the plane of the bottom side of the tray or the bottom 24 of the holders 7a.

In the depicted embodiment each holder 7a serves to hold a stack of metal-ceramic substrates 3a, which are accommodated upright in the respective holder, i.e. with their surface sides perpendicular to the plane of the bottom 24 or to the plane of the bottom of the tray. To facilitate removal of the metal-ceramic substrates 3a from the holders 7a the outer holders 7a of each row are provided on their ends adjacent to the edge areas 9.3 and 9.4 with a rounded expansion 29.

In the case of the embodiment depicted in FIGS. 8-11 the single holders 7a in top view of the tray 1a and in the longitudinal tray direction or in the direction of the edge areas 9.1 and 9.2 have a length of approximately 44-45 units and in the transverse tray direction or in the direction of the edge areas 9.3 and 9.4 a width of approximately 33-35 units. The grid distance between two adjacent holders 7a in a row is approximately 65 units and the center distance between two adjacent rows of holders 7a is approximately 66 units. The width between the transitions 28 and the rounded recesses 29 in an axis direction parallel to the top side of the tray and perpendicular to the edge areas 9.1 and 9.2 is for example 20 units, one unit likewise preferably being 1 mm.

With respect to the outer dimensions the tray 1a corresponds to the tray 1 so that it is not only possible to use the tray 1a instead of the tray 1 in existing production plants or production facilities, but also in particular it is possible to use the tray 1a in a stack with the tray 1, for example the tray 1a in a stack with a tray 1 of the package 2.

A component of the package comprising at least one tray 1a is likewise the covering formed by the bag-like or hose-like foil 21, which after insertion of the tray 1a provided with the ceramic substrate 3a is at least evacuated and sealed vacuum-tight, namely in the same manner as described above for the package 2 consisting of the tray 1 and the covering 21. Due to the reduced internal pressure in the covering 21 compared with the normal atmospheric pressure the metal-ceramic substrates 3a are likewise fixed in the holders 7a, namely in part by the covering 21 in contact with the top side of the tray against the metal-ceramic substrates 3a, and in particular by the fact that forces exerted by the atmospheric pressure on the edge 9 and thereby especially on the edge areas 9.1 and 9.2 produce a certain clamping effect for fixing the metal-ceramic substrates 3a in the holders 7a, namely due to slight deformation of the tray 1a.

In the case of the package comprising the tray 1a it is likewise possible to accommodate a plurality of such trays, provided with the metal-ceramic substrates 3a, the trays being stacked one above the other in the covering 21, corresponding to FIG. 5.

The invention was described above based on exemplary embodiments. It goes without saying that numerous modifications and variations are possible, without abandoning the underlying inventive idea on which the invention is based.

REFERENCE LIST 1, 1a tray
2 package
3, 3a metal-ceramic substrate
4 ceramic layer
5 metallization
5.1 single metallization
6 break-off line
7, 7a holder in tray 1
8 bottom
9 edge
9.1-9.4 edge area
10 bottom projections
11 profile or wall section
12 leg
12.1 rounded corner
13, 14 wall section
15 projection
15.1 upper edge
15.2 lower edge
16 corner
17 corner recess
17.1 extension
18 depression
19, 20 projection
21 bag-like or hose-like foil
21.1 sub-section
21.2, 21.3 gradient of the foil 21
22 tray section
23 groove-shaped depression
23.1 extension of the groove-shaped depression 23
24 bottom of the holders 7a
25 circumferential wall section of the holders 7a
26 bottom of depression 23
27 circumferential wall section of the recess 23
28 transition area between two holders 7a
29 recess
b width of the leg 12
L length of the rectangular metal-ceramic substrates 3
B width of the rectangular metal-ceramic substrates
F external force exerted by ambient pressure
, angles

The invention claimed is:
1. A package and a plurality of stacked metal-ceramic substrates held within the package, comprising:
the plurality of stacked metal-ceramic substrates, each of the plurality of stacked metal-ceramic substrate consisting of a ceramic layer and a plurality of single metallizations formed on at least one surface side of the ceramic layer, the plurality of stacked metal-ceramic substrates having break-off lines extending between the plurality of single metallizations;

a tray comprising at least one holder adapted to a format of the plurality of stacked metal-ceramic substrates holding the plurality of stacked metal-ceramic substrates, wherein a depth of the at least one holder is such that the plurality of stacked ceramic metal substrates are stacked such that one of the plurality of stacked metal-ceramic substrates is positioned above another of the plurality of stacked metal-ceramic substrates, and the plurality of stacked metal-ceramic substrates fit entirely within the at least one holder, the at least one holder having an interior defined by a bottom and circumferentially by an circumferential edge, the at least one holder is provided circumferentially with corner recesses and edge areas forming the circumferential edge and the corner recesses and the edge areas merge into each other to form a U-profile that is open toward the bottom side of the tray, the U-profile being defined by a circumferential first wall section forming an outer surface of the circumferential edge, a second wall section circumferentially limiting at least one holder and forming an inner surface of the circumferential edge, and a third wall section connecting the first wall section and the second wall section in a yoke-like manner; and the tray also includes a covering completely enclosing the plurality of stacked metal-ceramic substrates located in the holder, wherein the tray is evacuated to vacuum seal the covering about the plurality of stacked metal-ceramic substrates so that the plurality of stacked metal-ceramic substrates are fixed in the at least one holder by clamping on an edge-side of the tray by forces (F) exerted on the circumferential edge resulting from ambient pressure created by the vacuum.

2. The package according to claim 1, wherein the tray has projections on an outer side of the circumferential edge.

3. The package according to claim 1, wherein outer dimensions of the tray ranges from 208 to 238 mm and inner dimensions the at least one holder ranges from 127 to 179 mm.

4. The package according to claim 1, whereby the tray has a rectangular shape, a sub-space of the at least one holder has an effective width on the circumferential edge of the tray on a longer side that is approximately 19% to 20% of a width of the tray, and the sub-space of the at least one holder has on a narrower side or edge area having a width of the circumferential edge on a narrower sides of the tray that is approximately 12% to 13% of an outer dimension of the tray on a longer side.

5. The package according to claim 1, wherein the covering consists of a weldable plastic foil.

6. The package according to claim 1, wherein the circumferential edge has a width of from 5-45 mm.

7. The package according to claim 1, further comprising a leg projecting from the first wall section of the circumferential edge and forming a circumferential edge section, the circumferential edge section being rounded on the corners of the tray, with a radius between 1.5 and 40 mm.

8. The package according to claim 1, wherein the tray further comprises at least two holders for the plurality of stacked metal-ceramic substrates, the at least two holders being arranged in at least one row, the at least one row extending parallel to one circumferential side of the tray, and the at least two holders of the at least one row being formed by a joint recess on a tray top side, the joint recess has a reduced width or depth at a transition between the at least two holders.

* * * * *